United States Patent
Feng et al.

(10) Patent No.: US 9,209,056 B2
(45) Date of Patent: Dec. 8, 2015

(54) OVERHEAD BUFFER DEVICE AND WAFER TRANSPORT SYSTEM

(71) Applicant: INOTERA MEMORIES, INC., Taoyuan County (TW)

(72) Inventors: Hang-Hao Feng, Taoyuan County (TW); Sheng-Jung Chang, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 404 days.

(21) Appl. No.: 13/742,533

(22) Filed: Jan. 16, 2013

(65) Prior Publication Data

US 2014/0112740 A1   Apr. 24, 2014

(30) Foreign Application Priority Data

Oct. 19, 2012   (TW) .............................. 101138662 A

(51) Int. Cl.
| | | |
|---|---|---|
| *H01L 21/677* | (2006.01) | |
| *B65G 49/07* | (2006.01) | |
| *B61B 3/02* | (2006.01) | |
| *B61B 10/02* | (2006.01) | |

(52) U.S. Cl.
CPC .... *H01L 21/67769* (2013.01); *H01L 21/67733* (2013.01); *B61B 3/02* (2013.01); *B61B 10/022* (2013.01); *B65G 49/07* (2013.01); *H01L 21/67775* (2013.01)

(58) Field of Classification Search
CPC .............. B61B 3/00; B61B 3/02; B61B 5/00; B61B 5/02; B61B 10/02; B61B 10/022; B61B 10/027; H01L 21/67706; H01L 21/67727; H01L 21/6773; H01L 21/67733; H01L 21/67769; H01L 21/67775; Y10S 414/14; B65G 49/07

USPC ..................... 198/347.1, 347.2, 347.3, 347.4; 414/277, 278, 281, 285, 331.03, 414/331.04, 331.12, 331.14, 331.15, 414/331.18, 940

See application file for complete search history.

(56) References Cited

U.S. PATENT DOCUMENTS

| | | | |
|---|---|---|---|
| 6,481,558 B1 | 11/2002 | Bonora et al. | |
| 6,726,429 B2 * | 4/2004 | Sackett et al. | ................ 414/217 |

FOREIGN PATENT DOCUMENTS

| | | |
|---|---|---|
| EP | 2070617 A2 | 6/2009 |
| GB | 2362373 B | 3/2003 |
| TW | 446674 B | 7/2001 |
| TW | 5141618 B | 12/2002 |
| TW | 200927620 A | 7/2009 |
| TW | 201222700 A | 6/2012 |
| TW | M436927 U | 9/2012 |

OTHER PUBLICATIONS

Communication From the Taiwan Patent Office Regarding a Counterpart Foreign Application Dated (Taiwan Year 103) Jun. 26, 2014.

* cited by examiner

*Primary Examiner* — Ernesto Suarez
*Assistant Examiner* — Brendan Tighe
(74) *Attorney, Agent, or Firm* — Rosenberg, Klein & Lee

(57) ABSTRACT

An overhead buffer device used for disposing in a semiconductor factory includes a strut module and a plurality of buffer modules. The strut module disposed on the top wall of the factory has a horizontal beam and a plurality of overhead strut. The overhead strut is set on the horizontal beam and spaced arranged along the horizontal beam. The buffer modules are installed on the overhead strut respectively. Each buffer module has a plurality of buffers arranged in sequence and along a vertical direction. Each buffer is used for receiving one front opening unified pod (FOUP). Thus, the instant disclosure can be used for using the space of the factory efficiently. Besides, the instant disclosure also provides a wafer transport system having the overhead buffer device.

9 Claims, 4 Drawing Sheets

OVERHEAD BUFFER DEVICE AND WAFER TRANSPORT SYSTEM

FIELD OF THE INVENTION

The instant disclosure relates to a storage buffering device and a transport system; more particularly, to an overhead buffer device and a wafer transport system.

DESCRIPTION OF RELATED ART

Advance in technology today, the semiconductor industry has become one of the most important manufacturing industries, and the mainstream production process of the semiconductor industry develops toward the high-end process as technology development. For one thing, the norm of semiconductor fabrication has moved from 8-inch wafer gradually toward 12-inch wafer.

However, the weight of 12-inch wafer is not humanly possible load, so that transportation of the 12-inch wafer must rely on the automated material handling system (AMHS). Furthermore, as shown in FIG. 1, each processing tool 1a of the wafer transport system 10a is only equipped with a buffer region 2a, which is used for receiving one front opening unified pod (FOUP). That is to say, if the buffer region 2a occupied by a FOUP, additional FOUPs must be transported to a wafer stocker 3a.

Thus, providing a wafer transportation system that can utilize limited space as well as offering better transportation efficiency has become an important issue in the semiconductor industry, in order to increase the FOUP receiving number of buffer region for reducing the production cycle time.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides an overhead buffer device and a wafer transport system for reducing the production cycle time.

The wafer transport system, configured to be disposed in a semi-conductor factory for transporting a plurality of front opening unified pods (FOUPs), comprising: an overhead track installed on a top wall of the semi-conductor factory; an overhead transport vehicle movably disposed on the overhead track; a processing tool having at least one load port, wherein the load port is arranged under the overhead track; and an overhead buffer device, comprising: a strut module installed on the top wall of the semi-conductor factory, wherein the strut module has a horizontal beam and a plurality of overhead struts hung on the horizontal beam, and the overhead struts are spacedly arranged along the horizontal beam; and a plurality of buffer modules respectively hung on the overhead struts, wherein each buffer module has a plurality of buffers stacked along a vertical direction, and each buffer is configured to receive one FOUP; wherein the FOUPs are suitable to be transporting between the load port of the processing tool and each buffer of the buffer modules by the overhead transport vehicle.

Preferably, each buffer has a receiving box and a bottom seat slidably installed on a bottom of the receiving box, the bottom seat is configured to load one FOUP for transporting the FOUP to be arranged inside the receiving box or to be arranged under the overhead track.

Preferably, each bottom seat has a sensor, and wherein when the bottom seat is receiving one FOUP from the overhead transport vehicle, the sensor is configured to check whether the corresponding FOUP is disposed on a predetermined position of the bottom seat or not.

Preferably, a distance between a ground of the semi-conductor factory and each buffer module is at least two meter.

Preferably, each buffer has a top carrying portion and a bottom carrying portion, and any two adjacent buffers of each buffer module are stacked with each other by installing the bottom carrying portion of one buffer on the top carrying portion of another buffer.

Preferably, the horizontal beam is installed on the top wall of the semi-conductor factory, each overhead strut has a fixing piece, a carrying piece, and a connecting piece connected between the fixing piece and the carrying piece, and wherein each fixing piece is fixed on the horizontal beam, each carrying piece is installed with each buffer module, and each connecting piece is configured to adjust the distance between the carrying piece and the horizontal beam.

Preferably, each connecting piece has a plurality of retractable rods retracting along the vertical direction, two ends of each retractable rod are respectively fixed on the fixing piece and the carrying piece, and wherein the distance between the carrying piece and the horizontal beam is adjusted by the retractable rods.

Preferably, each connecting piece has a plurality of slidable rods, one end of each slidable rod is fixed on the carrying piece, each slidable rod is slidably installed on the fixing piece for sliding along the vertical direction with respective to the fixing piece, and wherein the distance between the carrying piece and the horizontal beam is adjusted by the slidable rods.

An overhead buffer device, configured to be disposed in a semi-conductor factory, comprising: a strut module installed on a top wall of the semi-conductor factory, wherein the strut module has a horizontal beam and a plurality of overhead struts hung on the horizontal beam, and the overhead struts are spacedly arranged along the horizontal beam; and a plurality of buffer modules respectively hung on the overhead struts, wherein each buffer module has a plurality of buffers stacked along a vertical direction, and each buffer has a receiving box and a bottom seat slidably installed on a bottom of the receiving box, the bottom seat is configured to load one FOUP for transporting the FOUP to be arranged inside/outside the receiving box.

Preferably, the horizontal beam is installed on the top wall of the semi-conductor factory, each overhead strut has a fixing piece, a carrying piece, and a connecting piece connected between the fixing piece and the carrying piece, and wherein each fixing piece is fixed on the horizontal beam, each carrying piece is installed with each buffer module, and each connecting piece is configured to adjust the distance the carrying piece and the horizontal beam.

Base on the above, the space of the semi-conductor factory is used more efficient by modularizing the buffers for increasing the product rate.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Please refer to FIGS. 2 to 6, which show an embodiment of the instant disclosure. The embodiment provides a wafer transport system 100, which is configured to be disposed in a semi-conductor factory 200 for transporting a plurality of front opening unified pods (FOUPs) 300.

Figure 1:
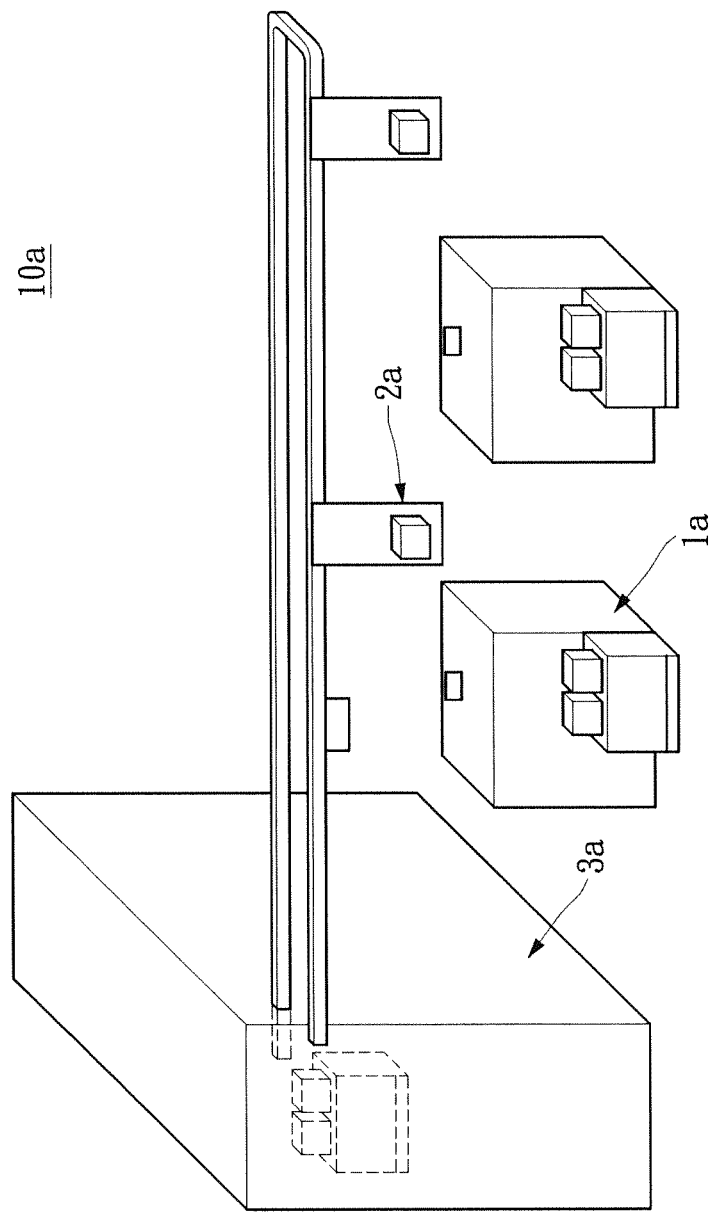
FIG. 1 is a perspective view of a conventional wafer transport system.
Figure 2:
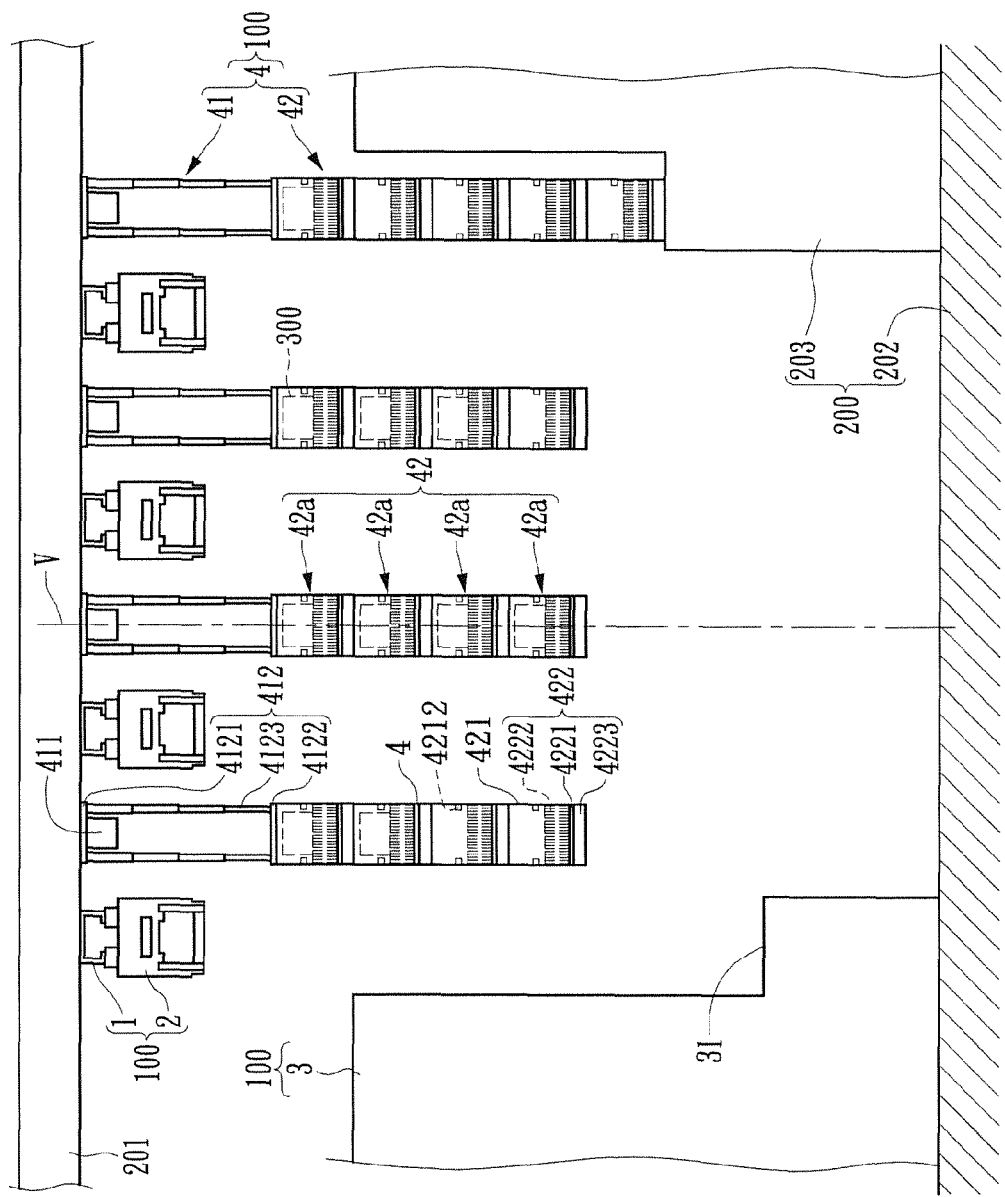
FIG. 2 is a planar perspective view of a wafer transport system of the instant disclosure arranged in a semi-conductor factory.

Please refer to FIG. 2. The wafer transport system 100 has a plurality of overhead tracks 1, a plurality of overhead transport vehicles 2, a plurality of processing tools 3, and a plurality of overhead buffer devices 4. The following description takes one group of the overhead track 1, the overhead transport vehicle 2, the processing tool 3, and the overhead buffer devices 4, which are cooperated with each other and shown at the left portion of FIG. 2, for example, but not limited thereto.

Moreover, the movement in this embodiment is driven by an outer device (not shown). The outer device is a conventional device, so that this embodiment does not state the outer device in the following description.

The overhead track 1 is installed on a top wall/ceiling 201 of the semi-conductor factory 200, and the overhead transport vehicle 2 is movably disposed (hung) on the overhead track 1. The processing tool 3 has at least one load port 31, and the load port 31 is arranged under the overhead track 1.

The overhead buffer device 4 includes a strut module 41 and a plurality of buffer modules 42, and the strut module 4 has a horizontal beam 411 and a plurality of overhead struts 412.

The horizontal beam 411 having a rectangular section is installed on the top wall 201 of the semi-conductor factory 200. The horizontal beam 411 is arranged at one lateral side of the overhead track 1 and is parallel to the overhead track 1.

The overhead struts 412 are hung on the horizontal beam 411, and the overhead struts 412 are spacedly arranged along the horizontal beam 412. In other words, the overhead struts 412 are arranged along a direction, which is from the paper of FIG. 2 to inside of the paper of FIG. 2. Moreover, each overhead strut 412 is just configured to carry one buffer module 42.

Figure 3:
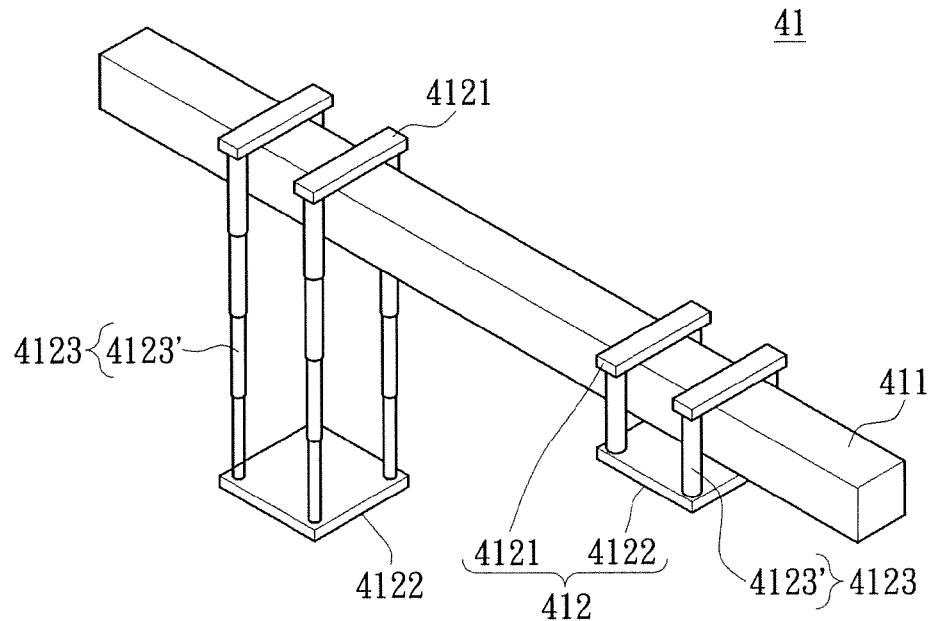
FIG. 3 is a perspective view of a strut module of the instant disclosure.

Please refer to FIGS. 2 and 3, wherein FIG. 3 is a partial view of FIG. 2, and FIG. 3 shows the strut module 41 arranged along the direction, which is from the paper of FIG. 2 to inside of the paper of FIG. 2. Each overhead strut 412 has a fixing piece 4121, a carrying piece 4122, and a connecting piece 4123 connected between the fixing piece 4121 and the carrying piece 4122.

Each fixing piece 4121 is fixed on the horizontal beam 411. Specifically, each fixing piece 4121 having a strip shape fixing on the top edge of the horizontal beam 411 by screwing, welding, wedging, or the other suitable means. Each carrying piece 4122 having a plate shape provides one buffer module 42 to hang thereon. Each connecting piece 4123 is configured to adjust the distance between the carrying piece 4122 and the horizontal beam 411.

Specifically, each connecting piece 4123 has a plurality of retractable rods 4123' retracting along a vertical direction V. Two ends of each retractable rod 4123' are respectively fixed on the fixing piece 4121 and the carrying piece 4122. Thus, the distance between the carrying piece 4122 and the horizontal beam 411 is adjusted by the retractable rods 4123'.

Each retractable rod 4123' of FIG. 3 takes four segments for example, but not limited thereto. For example, the retractable rod 4123' can be designed to have two segments.

Figure 4:
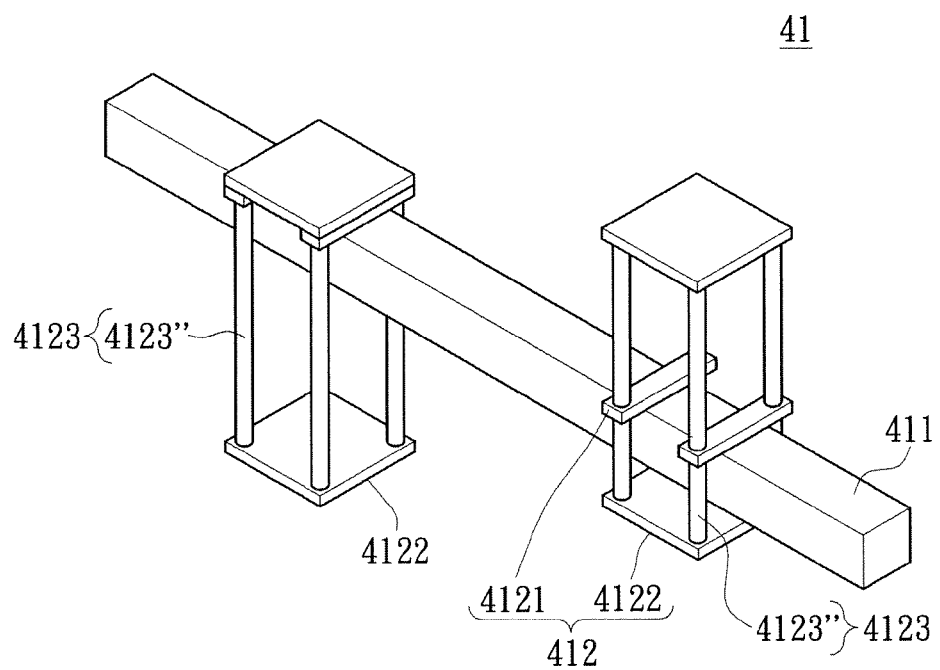
FIG. 4 is a perspective view of another type of the strut module of the instant disclosure.

Moreover, the overhead strut 412 can be designed as FIG. 4 shown, when the space between the horizontal beam 411 and the top wall 201 is large enough. Specifically, each connecting piece 4123 has a plurality of slidable rods 4123'. One end of each slidable rod 4123" is fixed on the carrying piece 4122, and each slidable rod 4123" is slidably installed on the fixing piece 4121 for sliding with respective to the fixing piece 4121 along the vertical direction V.

In other words, each slidable rod 4123" is slidable with respective to the fixing piece 4121 along the vertical direction V. Thus, the distance between the carrying piece 4122 and the horizontal beam 411 is adjusted by the slidable rods 4123".

Moreover, the overhead strut 412 in this embodiment takes the above two types for example, and the figures are schematic views, so that the overhead strut 412 in use is not limited to the above types and figures.

The design principle of the buffer modules 42 are identical, so that the following description states one overhead strut 412 and the corresponding buffer module 42 hung on the overhead strut 412 for example.

The buffer module 42 is hung on the carrying piece 4122 of the overhead strut 412, and the distance between a ground 202 of the semi-conductor factory 200 and the buffer modules 42 keeps at least two meter for having a best utilization of space as achieving the safe standard.

Each buffer module 42 has a plurality of buffers 42a stacked along the vertical direction V, and each buffer 42a is configured to receive one FOUP 300. Moreover, each buffer 42a has a receiving box 421 and a bottom seat 422 slidably installed on a bottom of the receiving box 421.

Figure 5:
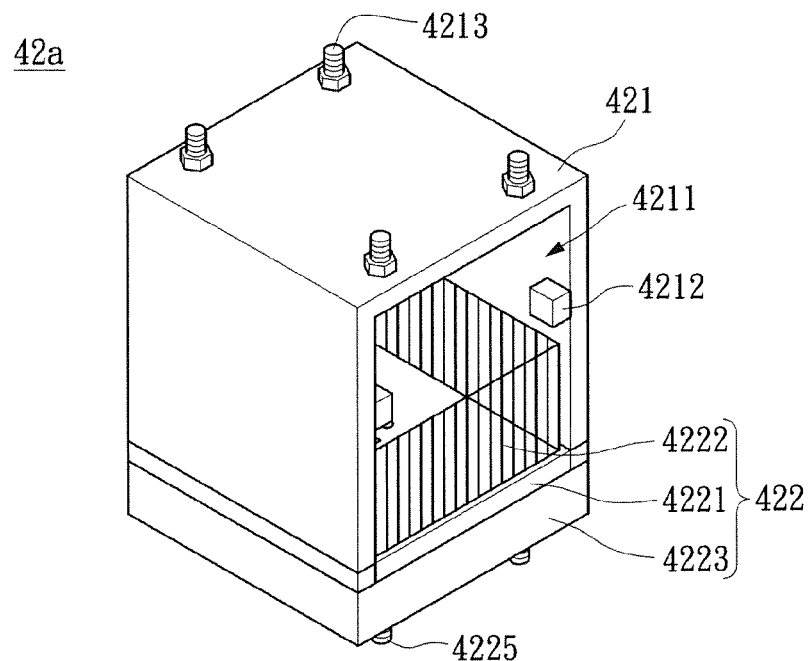
FIG. 5 is perspective view of a buffer of the instant disclosure.
Figure 6:
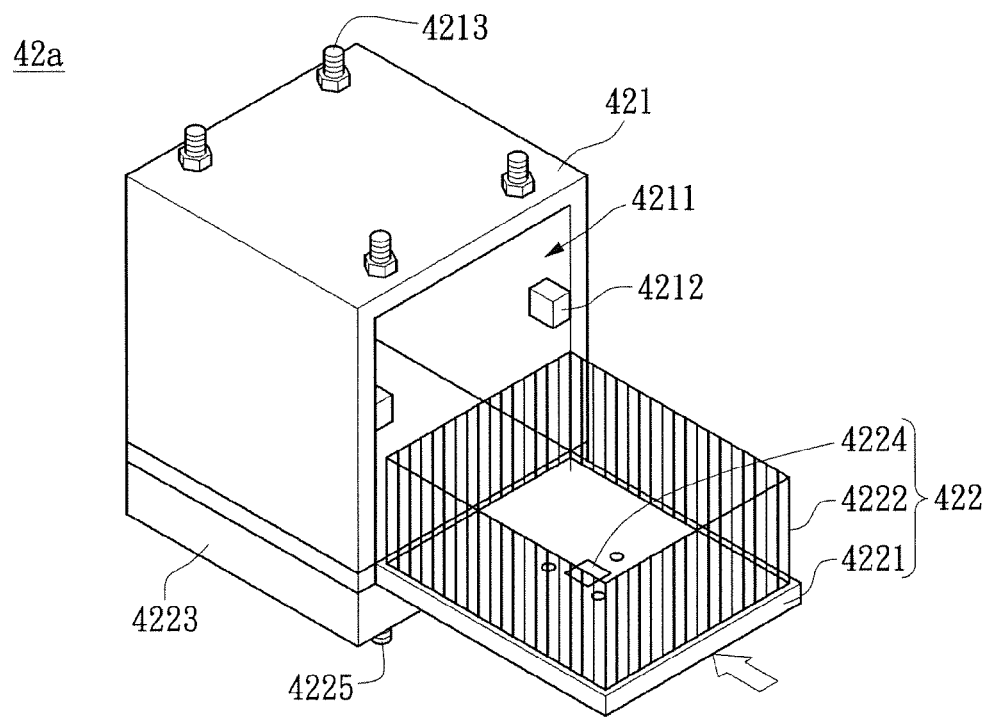
FIG. 6 is perspective view of the buffer in operating state of the instant disclosure.

Specifically, please refer to FIGS. 5 and 6. Two opposite ends of the receiving box 421 has an opening 4211 for providing the FOUP 300 to pass through, wherein the figures only show the right opening 4221. The receiving box 421 has two sets of sensors 4212 respectively arranged adjacent to the openings 4211. Each set of sensors 4212 has two infrared sensors, wherein one infrared sensor is used for emitting an infrared light, and another infrared sensor is used for receiving the infrared light.

The bottom seat 422 has a plate 4221, a fence 4222, and a traversing mechanism 4223. The plate 4221 is suitable to be received in the receiving box 421 and is used for loading one FOUP 300. The plate 4221 has a sensor 4224 (e.g., contact type sensor) exposed from a top surface thereof. The fence 4222 is perpendicularly installed on the periphery of the plate 4221, and the fence 4222 is suitable to be received in the receiving box 421 for preventing the FOUP 300 from falling out.

The traversing mechanism 4223 is installed on the plate 4221 for enabling the plate 4221 to selectively move through one of the openings 4211 to expose from the receiving box 421, so that the FOUP 300 disposed on the plate 4221 can be transported to inside the receiving box 421 or under the overhead track 1 by the traversing mechanism 4223.

The traversing mechanism 4223 is configured to move the plate 4221 exposed from the receiving box 421, but the structure of the traversing mechanism 4223 is not limited in this embodiment.

Moreover, each buffer 42a has a top carrying portion 4213 and a bottom carrying portion 4225 arranged at a top and a bottom thereof. Any two adjacent buffers 42a of each buffer module 42 are stacked with each other by installing the bottom carrying portion 4225 of one buffer 42a on the top carrying portion 4213 of another buffer 42a. The buffer 42a arranged at the top of each buffer module 42 is hung on the carrying piece 4122 by the top carrying portion 4213 thereof.

Specifically, the buffer 42a can be installed with the adjacent buffer 42a or the carrying piece 4122 by screwing, wedging, buckling, or the other separable means.

Additionally, the top carrying portion 4213 in this embodiment is disposed on the top portion of the receiving box 421, and the bottom carrying portion 4225 is disposed on the bottom portion of the traversing mechanism 4223, but not limited thereto.

When the FOUP 300 needs to be disposed in the buffer 42a, the plate 4221 of the bottom seat 422 is adjusted to move out from the receiving box 421 and under the overhead transport vehicle 2 (or the overhead track 1) by the traversing mechanism 4223. Specifically, the overhead transport vehicle 2 is transporting the FOUP 300 to the plate 4221, and then the FOUP 300 is disposed on the plate 4221 and is surrounded by the fence 4222, wherein the sensors 4224 check whether the FOUP 300 is disposed on a predetermined position (e.g., the correct position) of the plate 4221 or not.

After that, the traversing mechanism 4223 makes the plate 4221 and the corresponding FOUP 300 be received in the receiving box 421 by passing through the corresponding opening 4211. And then, the corresponding set of sensors 4212 check whether the FOUP 300 is disposed in the receiving box 421 or not. Specifically, if the FOUP 300 exposes from the receiving box 421, such as the FOUP 300 locates at the infrared transmitting path of the set of sensors 4212, the set of sensors 4212 send an alert for avoiding danger.

The taking out process, which is about taking out the FOUP 300 from the buffer 42a by the overhead transport vehicle 2, is similar to the above process, which is about disposing the FOUP 300 in the buffer 42a. Thus, the following description does not state the taking out process.

Thus, the FOUPs 300 can be transported between the load ports 31 of the processing tools 3 and the buffers 42a of the overhead buffer device 4 by the overhead transport vehicles 2.

Moreover, please refer to the right portion of FIG. 2, if a side wall 203 is arranged under the strut module 4, the strut module 4 can be designed to has the buffers 42a along the vertical direction V toward the side wall 203, and the distance between the side wall 203 of the semi-conductor factory 200 and the buffer modules 42 needs not to keep at least two meter.

Base on the above, the number of buffers 42a can be adjusted according to the user's demand and the space provided from the semi-conductor factory 200 as achieving safety standard, that is to say, the space of the semi-conductor factory 200 can be used efficiency by increasing the number of the buffers 42a, in order to reducing the use of the wafer stocker (not shown) and the production cycle.

Moreover, if the number of buffers 42a arranged in the semi-conductor factory 200 is large enough to satisfy the corresponding need of the processing tools 3, the wafer stocker can be replaced by the buffers 42a.

Additionally, if moving a large apparatus, which has height more than two meter, via the overhead buffer device 4 in the semi-conductor factory 200, the distance between the buffer modules 42 and the ground 202 can be increased by adjusting the overhead struts 412 to move up the buffer module 42 for providing enough space to the large apparatus passing through.

Base on the above, the space of the semi-conductor factory is used more efficient by adjusting the number of the buffers and retracting the overhead strut.

Moreover, if the number of buffers arranged in the semi-conductor factory is large enough to satisfy the corresponding need of the processing tools, the wafer stocker can be replaced by the buffers for reducing the cost.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A wafer transport system, configured to be disposed in a semi-conductor factory for transporting a plurality of front opening unified pods (FOUPs), comprising:
    an overhead track installed on a top wall of the semi-conductor factory;
    an overhead transport vehicle movably disposed on the overhead track;
    a processing tool having at least one load port, wherein the load port is arranged under the overhead track; and
    an overhead buffer device, comprising:
        a strut module installed on the top wall of the semi-conductor factory, wherein the strut module has a horizontal beam and a plurality of overhead struts hung on the horizontal beam, and the overhead struts are spacedly arranged along the horizontal beam; and
        a plurality of buffer modules respectively hung on the overhead struts, wherein each buffer module has a plurality of buffers stacked along a vertical direction, and each buffer is configured to receive one FOUP;
        wherein each buffer has a top carrying portion and a bottom carrying portion, and any two adjacent buffers of each buffer module are detachably stacked with each other by installing the bottom carrying portion of one buffer on the top carrying portion of another buffer, thus the number of the stacked buffers of each buffer module is adjustable;
    wherein the FOUPs are transportable between the load port of the processing tool and each buffer of the buffer modules by the overhead transport vehicle.

2. The wafer transport system as claimed in claim 1, wherein each buffer has a receiving box and a bottom seat slidably installed on a bottom of the receiving box, the bottom seat is configured to load one FOUP for transporting the FOUP to be arranged inside the receiving box or to be arranged under the overhead track.

3. The wafer transport system as claimed in claim 2, wherein each bottom seat has a sensor, and wherein when the bottom seat is receiving one FOUP from the overhead transport vehicle, the sensor is configured to check whether the corresponding FOUP is disposed on a predetermined position of the bottom seat or not.

4. The wafer transport system as claimed in claim 1, wherein a distance between a ground of the semi-conductor factory and each buffer module is at least two meter.

5. The wafer transport system as claimed in claim 1, wherein the horizontal beam is installed on the top wall of the semi-conductor factory, each overhead strut has a fixing piece, a carrying piece, and a connecting piece connected between the fixing piece and the carrying piece, and wherein each fixing piece is fixed on the horizontal beam, each carrying piece is installed with each buffer module, and each connecting piece is configured to adjust the distance between the carrying piece and the horizontal beam.

6. The wafer transport system as claimed in claim 5, wherein each connecting piece has a plurality of retractable rods retracting along the vertical direction, two ends of each retractable rod are respectively fixed on the fixing piece and the carrying piece, and wherein the distance between the carrying piece and the horizontal beam is adjusted by the retractable rods.

7. The wafer transport system as claimed in claim 5, wherein each connecting piece has a plurality of slidable rods, one end of each slidable rod is fixed on the carrying piece, each slidable rod is slidably installed on the fixing piece for sliding along the vertical direction with respective to the fixing piece, and wherein the distance between the carrying piece and the horizontal beam is adjusted by the slidable rods.

8. An overhead buffer device, configured to be disposed in a semi-conductor factory, comprising:
   a strut module installed on a top wall of the semi-conductor factory, wherein the strut module has a horizontal beam and a plurality of overhead struts hung on the horizontal beam, and the overhead struts are spacedly arranged along the horizontal beam; and
   a plurality of buffer modules respectively hung on the overhead struts, wherein each buffer module has a plurality of buffers stacked along a vertical direction, and each buffer has a receiving box and a bottom seat slidably installed on a bottom of the receiving box, the bottom seat is configured to load one FOUP for transporting the FOUP to be arranged inside/outside the receiving box,
   wherein each buffer has a top carrying portion and a bottom carrying portion, and any two adjacent buffers of each buffer module are detachably stacked with each other by installing the bottom carrying portion of one buffer on the top carrying portion of another buffer, thus the number of the stacked buffers of each buffer module is adjustable.

9. The overhead buffer device as claimed in claim 8, wherein the horizontal beam is installed on the top wall of the semi-conductor factory, each overhead strut has a fixing piece, a carrying piece, and a connecting piece connected between the fixing piece and the carrying piece, and wherein each fixing piece is fixed on the horizontal beam, each carrying piece is installed with each buffer module, and each connecting piece is configured to adjust the distance the carrying piece and the horizontal beam.

\* \* \* \* \*